United States Patent [19]
Ichinose

[11] 4,058,970
[45] Nov. 22, 1977

[54] DIGITAL DISPLAY ELECTRONIC TIMEPIECE

[75] Inventor: Matzuo Ichinose, Suwa, Japan

[73] Assignee: Kabushiki Kaisha Suwa Seikosha, Tokyo, Japan

[21] Appl. No.: 666,298

[22] Filed: Mar. 12, 1976

[30] Foreign Application Priority Data

Mar. 12, 1975 Japan .................... 50-29844

[51] Int. Cl.² ............................. G04C 3/00
[52] U.S. Cl. ............................ 58/23 R; 58/50 R; 58/23 BA; 350/160 LC
[58] Field of Search ............... 58/23 R, 23 BA, 50 R, 58/55; 350/160 LC; 340/336; 174/68.5; 29/625, 626

[56] References Cited
U.S. PATENT DOCUMENTS

| | | | |
|---|---|---|---|
| 3,778,999 | 12/1973 | Vuffray | 58/23 R |
| 3,846,971 | 11/1974 | Ho et al. | 58/23 R |
| 3,857,628 | 12/1974 | Strong | 350/160 LC |
| 3,866,406 | 2/1975 | Roberts | 58/55 X |
| 3,932,024 | 1/1976 | Yaguchi et al. | 350/160 LC |
| 3,952,405 | 4/1976 | Vest | 350/160 LC X |
| 3,981,138 | 9/1976 | Levine et al. | 58/23 R |
| B 354,510 | 1/1975 | Van Boxtel et al. | 350/160 LC X |

*Primary Examiner*—Ulysses Weldon
*Attorney, Agent, or Firm*—Blum, Moscovitz, Friedman & Kaplan

[57] ABSTRACT

An electronic timepiece wherein the operative elements defining the digital display timepiece circuitry are formed on an organic film substrate is provided. The digital display electronic timepiece circuit includes a battery and timekeeping circuitry coupled to the battery in order to be energized thereby and produce low frequency timekeeping signals representative of actual time. The timekeeping circuitry is integrated into at least one circuit chip. A digital display panel receives the timekeeping signals and digitally displays time in response thereto. The organic film substrate supports the display panel each timekeeping circuitry circuit chip and circuit wiring operatively connecting the display panel and chip and formed on said substrate on the same side thereof. Other electrical components of said timepiece may be supported on the opposite side of the substrate.

7 Claims, 6 Drawing Figures

DIGITAL DISPLAY ELECTRONIC TIMEPIECE

BACKGROUND OF THE INVENTION

This invention is directed to an improved digital display electronic timepiece circuit assembly and in particular to the mounting of each of the circuit elements in a digital display electronic timepiece to the same organic film substrate to facilitate assembly of an electronic timepiece.

In the horology art, the development of accurate small sized time standards such as quartz crystal vibrators, and the like, has changed the emphasis in wristwatches from mechanical movements to quartz crystal electronic timepiece circuitry capable of providing highly accurate low frequency timekeeping signals. Specifically, a quartz crystal vibrator is utilized in an oscillator circuit to produce a high frequency time standard signal, which signal is then applied to appropriate divider circuitry which divides the high frequency signal into the low frequency timekeeping signal to be applied to an appropriate display. Such electronic timepiece circuitry is particularly adapted for providing a digital display of actual time. By providing appropriate driving and decoding circuitry and a liquid crystal or light emitting diode digital display panel, the low frequency timekeeping signal produced by the divider is digitally displayed. As the assembly of such digital display electronic wristwatches has been simplified and automated, the cost of such watches has been substantially reduced thereby contributing to the popularity thereof. Nevertheless, the state of the art forms of digital display electronic timepiece circuit assemblies are expensive and of lessened reliability, in particular due to the methods of effecting electrical and mechanical coupling of the essential elements of the digital display electronic timepiece circuit, to wit, the digital display panel and integrated circuit chips.

SUMMARY OF THE INVENTION

Generally speaking, in accordance with the invention, a digital display electronic timepiece circuit assembly wherein each of the operative elements defined in the electronic timepiece circuit are mounted to an organic film substrate is provided. The digital display electronic timepiece circuit includes a battery and timekeeping circuitry coupled to the battery for producing low frequency timekeeping signals representative of actual time. The timekeeping circuitry is formed in at least one integrated circuit chip. A digital display panel is coupled to the timekeeping circuitry for receiving the timekeeping signal and digitally displaying time in response thereto. The organic film substrate supports, on the same side thereof, the display panel, each timekeeping circuitry integrated circuit chip and circuit wiring operatively coupling said display panel and said chip and formed on said organic film. Other electrical components of said timepiece including said battery are supported on the side of said organic film opposite to said panel and chip.

Accordingly, it is an object of the instant invention to provide an improved digital display electronic timepiece circuit assembly wherein each of the operative elements of the timepiece circuit are disposed on an organic film substrate.

A further object of the instant invention provides an electronic timepiece circuit assembly wherein each of the elements forming the electronic timepiece circuit are mounted on a single organic film substrate for reducing the cost of assembly and improving the reliability of the electronic timepiece circuitry.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
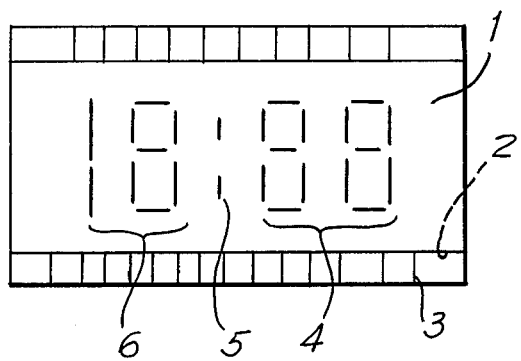
FIG. 1 is a plan view of a digital display panel constructed in accordance with the prior art.

Reference is now made to FIG. 1, wherein a liquid crystal digital display panel for use in a digital display electronic wristwatch for displaying hours and minutes is depicted. The display includes liquid crystal display segments 4 for defining minutes and tens of minutes display digits and liquid crystal hours and ten hour display segments 6 and dot display segments 5. A segment electrode lead 3 for each liquid crystal display segment is formed on the back side of front glass 1, the display panel further including a back glass panel 2, more specifically illustrated in FIG. 3. As will be detailed below, the methods of electrical coupling segment electrode leads 3 to the timekeeping circuitry obtained in the prior art has been less than completely satisfactory.

Figure 2:
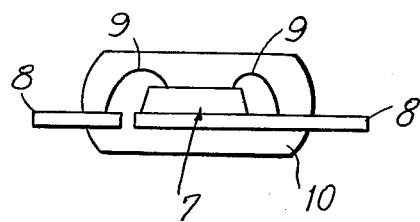
FIG. 2 is a representational view of a transfer molded integrated circuit chip assembly constructed in accordance with the prior art.

Reference is now made to FIG. 2 wherein a transfer molded integrated circuit chip assembly is depicted. An integrated circuit chip 7 is bonded to lead or substrate electrodes 8 by connecting wires 9 interconnecting the bonding pads of the integrated circuit chip 7 and the lead or substrate electrodes 8. Thereafter, the lead or substrate electrodes 8, integrated circuit chip 7 and connecting wires 9 are transfer molded into a plastic molding compound 10 to define a one piece construction.

Figure 3:
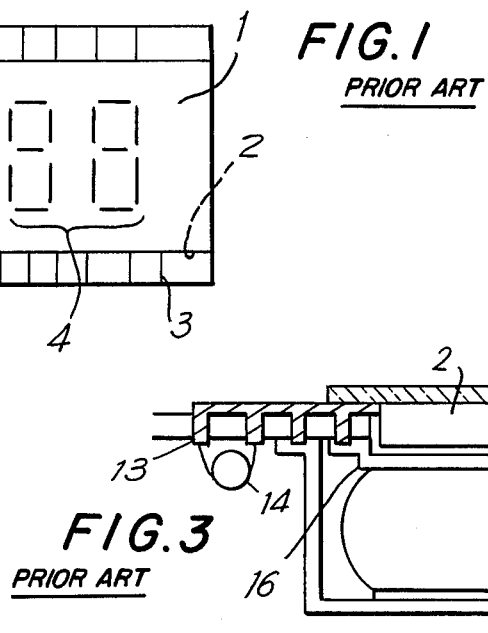
FIG. 3 is a sectional view of a digital display electronic timepiece circuit assembly constructed in accordance with the first embodiment of the prior art.

Reference is now made to FIG. 3, wherein a digital display electronic timepiece circuit assembly constructed in accordance with the first embodiment of the prior art is depicted. Like reference numerals being utilized to denote like elements. The segment electrode leads 3 on the back surface of the front glass 1 of the liquid crystal digital display panel are electrically coupled by thermo-compression bonding or by a conductive paste to wire electrodes 12 formed on a base 11. The wire electrodes 12 are formed with through-holes wires 13 extending through through-holes in base 11. The lead or substrate electrodes 8 coupled to the integrated circuit chip are coupled to the through-hole wires 13 by solder or the like. Any further operative elements of the electronic timepiece such as the quartz crystal oscillator 14 are also coupled to through-hole wires 13 in substrate 11. A first positive electrode 16 couples the positive terminal of the DC battery 15 to a through-hole wire 13 and a second negative electrode 17 couples the negative terminal of the DC battery 15 to a through-hole wire 13 and a second negative electrode 17 couples the negative terminal of the DC battery 15 to a further through-hole wire disposed in the substrate 11.

Figure 4:
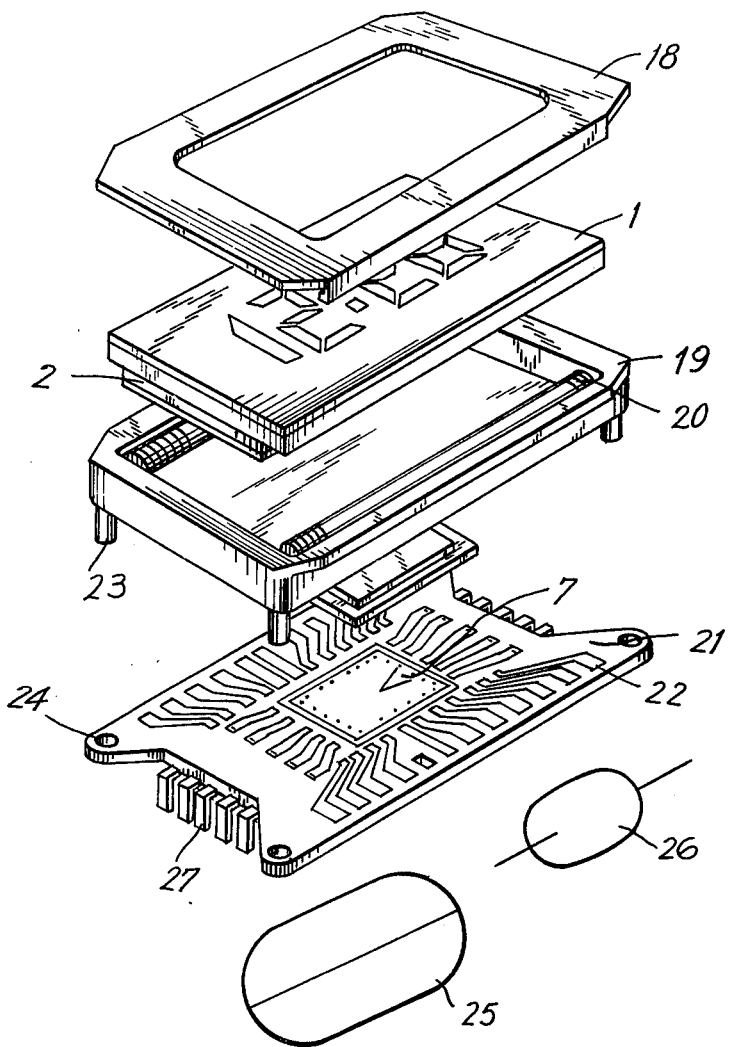
FIG. 4 is an exploded prospective view of the digital display electronic timepiece circuit assembly constructed in accordance with a further embodiment of the prior art.

Reference is now made to FIG. 4, wherein a further digital display electronic timepiece circuit assembly constructed in accordance with the prior art is depicted, like reference numerals being utilized to denote like elements as described above. An integrated circuit chip 7 is bonded to a base plate 21, which base plate supports wire electrodes 22 on the upper side thereof and through-hole wires 27 projecting on the lower side thereof. Wire electrodes 22 and through-hole wires 27 are electrically coupled to chip 7. Additionally, the wire electrodes 22 are connected to the segment electrode leads of the liquid crystal display panel 1 through a connecting substrate 19 supporting anisotropic rubber conductors 20 and including positioning projections 23 for mating with apertures 24 in plate 21. Display panel 1 is fixedly secured to connecting substrate 19 by a panel cover 18. It is noted that the remaining electronic elements such as the timekeeping circuitry formed in an integrated circuit chip 26 and the battery 25 are connected to the through-hole electrodes 27 projecting from the lower side of its base plate 21.

Accordingly, in prior art digital display electronic timepiece circuit assemblies, the base plate is provided with a particular wiring configuration on both sides with through-hole electrodes for interconnecting elements in both sides of the base plate. The greater the number of through hole electrodes required, the greater the cost in forming the timepiece circuit assembly. For example, in the embodiment depicted in FIG. 3, the use of thermo-compression bonding ultrasonics for connecting the segment electrode leads of the digital display panel to the base plate electrodes is extremely difficult since the base plate is hard, utilizing conductive pastes and the like is undesirable since such conductive pastes are likely to spread thereby causing connection failures. On the other hand, in digital display electronic timepiece circuit assemblies of the type illustrated in FIG. 4, an anisotropic rubber conductor, substrate and cover panel 18 in addition to the wiring circuit board is required, thereby increasing the expense thereof. Accordingly, a simplified and thereby less expensive digital display electronic timepiece circuit assembly is desired.

Figure 5:
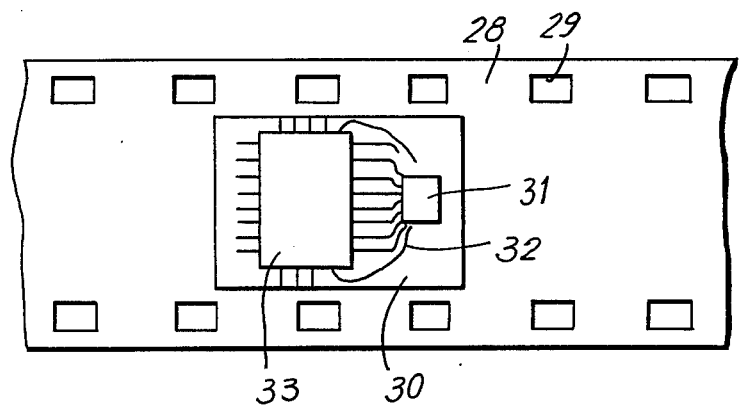
FIGS. 5 and 6 are plan and sectional views respectively of a digital display electronic timepiece circuit mounting assembly constructed in accordance with a preferred embodiment of the instant invention.
Figure 6:
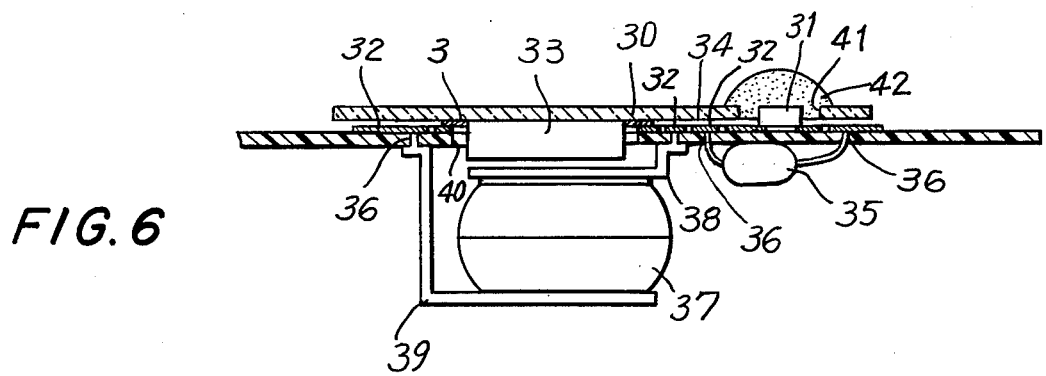

Reference is now made to FIGS. 5 and 6 wherein an example of a digital display timepiece circuit assembly constructed in accordance with the instant invention is depicted. An organic film substrate 28, a preferred embodiment being formed of a polyimide, includes guide holes 29 along the length thereof for facilitating assembly. Additionally, the polyimide film 28 includes a first hole 40 for receiving the back glass 33 of the liquid crystal digital display panel and further openings 36 for passage therethrough of electrical wires are provided in a polyimide film. The film has a thickness on the order of 25 $\mu$ to 150 $\mu$ and the hole 40 and openings 36 are formed by punching or photo-etching techniques. A hole 41 is formed in front glass plate 30 for passage of integrated circuit chip 31. Electrode wires 32 are formed on a first surface of the polyimide film 28 by bonding copper foil to the surface and thereafter photo-etching an electrode pattern thereon. The electrode pattern 32 is formed to coincide with the segment electrodes 34 on the back surface of the front plate 30 of the digital display panel and are coupled thereto by thermo-compression bonding or by the use of ultrasonic solder forming connecting techniques. In addition, the electrodes pads of the integrated circuit chip 31 and the electrode wire pattern 32 on the polyimide film 28 can be connected by thermo-compression bonding or ultrasonic connecting techniques whereafter the integrated circuit can be encapsulated by appropriate molding techniques as by material 42. The remaining electronic circuit elements 35, which can include the oscillator, correction circuitry and a capacitor, etc. are readily connected to the electrode wires 32 through the opening 36 in the polyimide film substrate 28. Similarly, the DC battery 37 is coupled through a positive electrode 38 and a negative electrode 39, which electrodes are readily coupled through the openings 36 in the polyimide film substrate to the electrode wire pattern 32 formed thereon.

Accordingly, the liquid crystal digital display panel is used as a base plate, and the organic polyimide film substrate with holes therein for coupling the wire pattern formed thereon to leads on the other side provides a simple and easy to assemble electronic timepiece circuit assembly. By utilizing the thin polyimide film substrate, assembly methods such a minimode, face up or face down can be utilized to effect electrical coupling and mechanical securing of the integrated circuitry. Additionally, the remaining electronic circuit elements comprising the timepiece circuit assembly such as the battery can be assembled on the polyimide film substrate and such assembly can be easily effected on a conveyor system by means of the notches 29 provided in the polyimide film, thereby further reducing the cost of assembly. Moreover, by such an assembly, additional circuit boards and base plate are eliminated and a simplified assembly is provided.

It will thus be seen that the objects set forth above, among those made apparent from the preceding description, are efficiently attained and, since certain changes may be made in the above article without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A digital display electronic timepiece circuit assembly comprising in combination battery means, timekeeping circuitry coupled to said battery means for being energized thereby and for producing low frequency timekeeping signals representative of actual time, said timekeeping circuitry being formed in at least one intergrated circuit chip, a digital display panel for receiving said timekeeping signals and digitally displaying time in response thereto, and an organic film substrate, said film substrate, including an electric wiring pattern formed on a first surface thereof, said substrate supporting said display panel and each said integrated circuit chip on said first surface to thereby electrically couple said display panel and each said chip together by said wire pattern, the surface of said film substrate not supporting said display panel being adapted to secure said battery means, said substrate having a first through-hole for receiving a portion of said display panel, said digital display panel including a front glass panel of substantially larger widthwise and lengthwise dimension then said portion of the display panel received in the through-hole of said substrate, the back surface of said front panel having segment electrode leads disposed thereon and coupled to said electrode wiring pattern formed on said first surface of said film substrate, said back surface of said glass panel being dimensioned to structurally support said organic film substrate and certain of said elements supported on the back surface thereof, said front glass panel further including an opening therein for permitting said integrated circuit chip to be supported on said organic film to extend through said opening.

2. A digital display electronic circuit assembly as claimed in claim 1, wherein said organic film substrate is a polyimide film.

3. A digital display electronic circuit assembly as claimed in claim 2, wherein the thickness of said polyimide film is in a range of 25 $\mu$ to 150 $\mu$.

4. A digital display electronic circuit assembly as claimed in claim 1, wherein said electric wire pattern is formed of copper.

5. A digital display electronic circuit assembly as claimed in claim 1, wherein said film substrate includes a further plurality of through-holes therein for permitting coupling of any circuit elements and said battery means disposed on the surface of said film not supporting said display panel to said electric wiring pattern formed on said first surface.

6. A digital display electronic circuit assembly as claimed in claim 5, and including capacitor means adapted to be coupled to said integrated circuit chip, said capacitor means being disposed on said battery means supporting surface of said organic film substrate and being coupled through said through-holes in said substrate to said integrated circuit chip.

7. A digital display electronic circuit assembly as claimed in claim 5, and including an oscillator means adapted to be coupled to said integrated circuit chip, said capacitor means being disposed on said battery means supporting surface of said organic film substrate and coupled through said through-holes in said substrate to said integrated chip.

* * * * *